United States Patent
Choi et al.

(10) Patent No.: US 12,532,699 B2
(45) Date of Patent: Jan. 20, 2026

(54) PHOTORESIST COATING APPARATUS

(71) Applicant: SAMSUNG ELECTRONICS CO., LTD., Suwon-si (KR)

(72) Inventors: Heeyun Choi, Suwon-si (KR); Kyoungwhan Oh, Suwon-si (KR); Hokyun Kim, Suwon-si (KR); Junhee Lee, Suwon-si (KR); Yohan Choe, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 79 days.

(21) Appl. No.: 18/524,164

(22) Filed: Nov. 30, 2023

(65) Prior Publication Data
US 2024/0213055 A1 Jun. 27, 2024

(30) Foreign Application Priority Data
Dec. 26, 2022 (KR) .......................... 10-2022-0185019

(51) Int. Cl.
*H01L 21/67* (2006.01)
*G03F 7/16* (2006.01)

(52) U.S. Cl.
CPC .......... *H01L 21/6715* (2013.01); *G03F 7/162* (2013.01); *H01L 21/67051* (2013.01); *H01L 21/67225* (2013.01)

(58) Field of Classification Search
CPC .......... H01L 21/6715; H01L 21/67051; H01L 21/67225
See application file for complete search history.

(56) References Cited

U.S. PATENT DOCUMENTS

| | | |
|---|---|---|
| 7,867,559 B2 | 1/2011 | Taniguchi et al. |
| 10,121,685 B2 | 11/2018 | Shite et al. |
| 10,403,501 B2 | 9/2019 | deVilliers et al. |
| 10,920,764 B2 | 2/2021 | Nishimura et al. |
| 2001/0016427 A1 | 8/2001 | Ueda |
| 2015/0328650 A1 | 11/2015 | Carcasi et al. |
| 2018/0074407 A1 | 3/2018 | Yoshihara et al. |
| 2021/0008588 A1 | 1/2021 | Ide et al. |
| 2021/0202274 A1 | 7/2021 | Yang et al. |

FOREIGN PATENT DOCUMENTS

| | | | |
|---|---|---|---|
| TW | 200625406 A | 7/2006 | |
| WO | WO-2019182036 A1 * | 9/2019 | ............. B05C 11/08 |

* cited by examiner

*Primary Examiner* — Minh Q Phan
(74) *Attorney, Agent, or Firm* — Morgan, Lewis & Bockius LLP

(57) ABSTRACT

A photoresist coating apparatus includes a photoresist trap tank temporarily storing a photoresist. A photoresist supply pipe is connected to the photoresist trap tank. A pump is connected to the photoresist supply pipe. A photoresist pressing device is connected to the photoresist supply pipe at a rear of the pump. A photoresist circulation pipe is at a rear of the photoresist pressing device. The photoresist circulation pipe connects the photoresist supply pipe to the photoresist trap tank. A photoresist discharge pipe is connected to the photoresist supply pipe at a rear of the photoresist circulation pipe. A photoresist discharge valve is connected to the photoresist discharge pipe. A photoresist discharge nozzle is connected to the photoresist discharge valve.

20 Claims, 17 Drawing Sheets

PHOTORESIST COATING APPARATUS

CROSS-REFERENCE TO RELATED APPLICATION

This application claims priority under 35 U.S.C. § 119 to Korean Patent Application No. 10-2022-0185019, filed on Dec. 26, 2022 in the Korean Intellectual Property Office, the disclosure of which is incorporated by reference in its entirety herein.

1. TECHNICAL FIELD

The present inventive concept relates to a photoresist coating apparatus, and more particularly, to a photoresist coating apparatus capable of increasing photoresist coating quality.

2. DISCUSSION OF RELATED ART

Examples of semiconductor device manufacturing processes include a thin film formation process, an ion implantation process, a photolithography process, a test process, an assembly process, and the like. In the photolithography process, a photoresist coating apparatus applies a photoresist to pattern a thin film formed on a substrate, such as a wafer. A photoresist film that is thinly applied on the wafer may be formed as a photoresist pattern by an exposure process and a development process. However, if the quality of the photoresist coating is poor, the yield of semiconductor devices may be significantly reduced.

SUMMARY

An embodiment of the present inventive concept provides a photoresist coating apparatus increasing photoresist coating quality.

According to an embodiment of the present inventive concept, a photoresist coating apparatus includes a photoresist trap tank temporarily storing a photoresist. A photoresist supply pipe is connected to the photoresist trap tank. A pump is connected to the photoresist supply pipe. A photoresist pressing device is connected to the photoresist supply pipe at a rear of the pump. A photoresist circulation pipe is at a rear of the photoresist pressing device. The photoresist circulation pipe connects the photoresist supply pipe to the photoresist trap tank. A photoresist discharge pipe is connected to the photoresist supply pipe at a rear of the photoresist circulation pipe. A photoresist discharge valve is connected to the photoresist discharge pipe. A photoresist discharge nozzle is connected to the photoresist discharge valve.

According to an embodiment of the present inventive concept, a photoresist coating includes a photoresist storage tank storing a photoresist. A photoresist suction pipe is connected to the photoresist storage tank. A photoresist trap tank is connected to the photoresist suction pipe. The photoresist trap tank temporarily stores the photoresist. A photoresist supply pipe is connected to the photoresist trap tank. A pump is connected to the photoresist supply pipe. A photoresist pressing device is connected to the photoresist supply pipe at a rear of the pump. A photoresist circulation pipe is at a rear of the photoresist pressing device. The photoresist circulation pipe connects the photoresist supply pipe to the photoresist trap tank. A photoresist discharge pipe is connected to the photoresist supply pipe at a rear of the photoresist circulation pipe. A photoresist discharge valve is connected to the photoresist discharge pipe. A photoresist discharge nozzle is connected to the photoresist discharge valve. The pump is a photoresist circulation pump circulating the photoresist at a first flow rate. The photoresist pressing device is a flow rate control device discharging the photoresist at a second flow rate that is greater than the first flow rate.

According to an embodiment of the present inventive concept, a photoresist coating apparatus includes a photoresist storage tank storing a photoresist. A photoresist suction pipe is connected to the photoresist storage tank. A first filter is connected to the photoresist suction pipe. The first filter filters particles in the photoresist. A photoresist trap tank is connected to the photoresist suction pipe. The photoresist trap tank temporarily stores the photoresist. A photoresist supply pipe is connected to the photoresist trap tank. A pump is connected to the photoresist supply pipe. A second filter is connected to the photoresist supply pipe at a rear of the pump. The second filter filters particles in the photoresist. A photoresist pressing device is connected to the photoresist supply pipe at a rear of the second filter. A photoresist circulation pipe is at a rear of the photoresist pressing device. The photoresist circulation pipe connects the photoresist supply pipe to the photoresist trap tank. A photoresist discharge pipe is connected to the photoresist supply pipe at a rear of the photoresist circulation pipe. A photoresist discharge valve is connected to the photoresist discharge pipe. A photoresist discharge nozzle is connected to the photoresist discharge valve. The pump is a photoresist circulation pump circulating the photoresist at a first flow rate. The photoresist pressing device is a flow rate control device discharging the photoresist at a second flow rate that is greater than the first flow rate.

BRIEF DESCRIPTION OF THE DRAWINGS

Embodiments of the present inventive concept will be more clearly understood from the following detailed description taken in conjunction with the accompanying drawings in which.

DETAILED DESCRIPTION OF EMBODIMENTS

Figure 1:
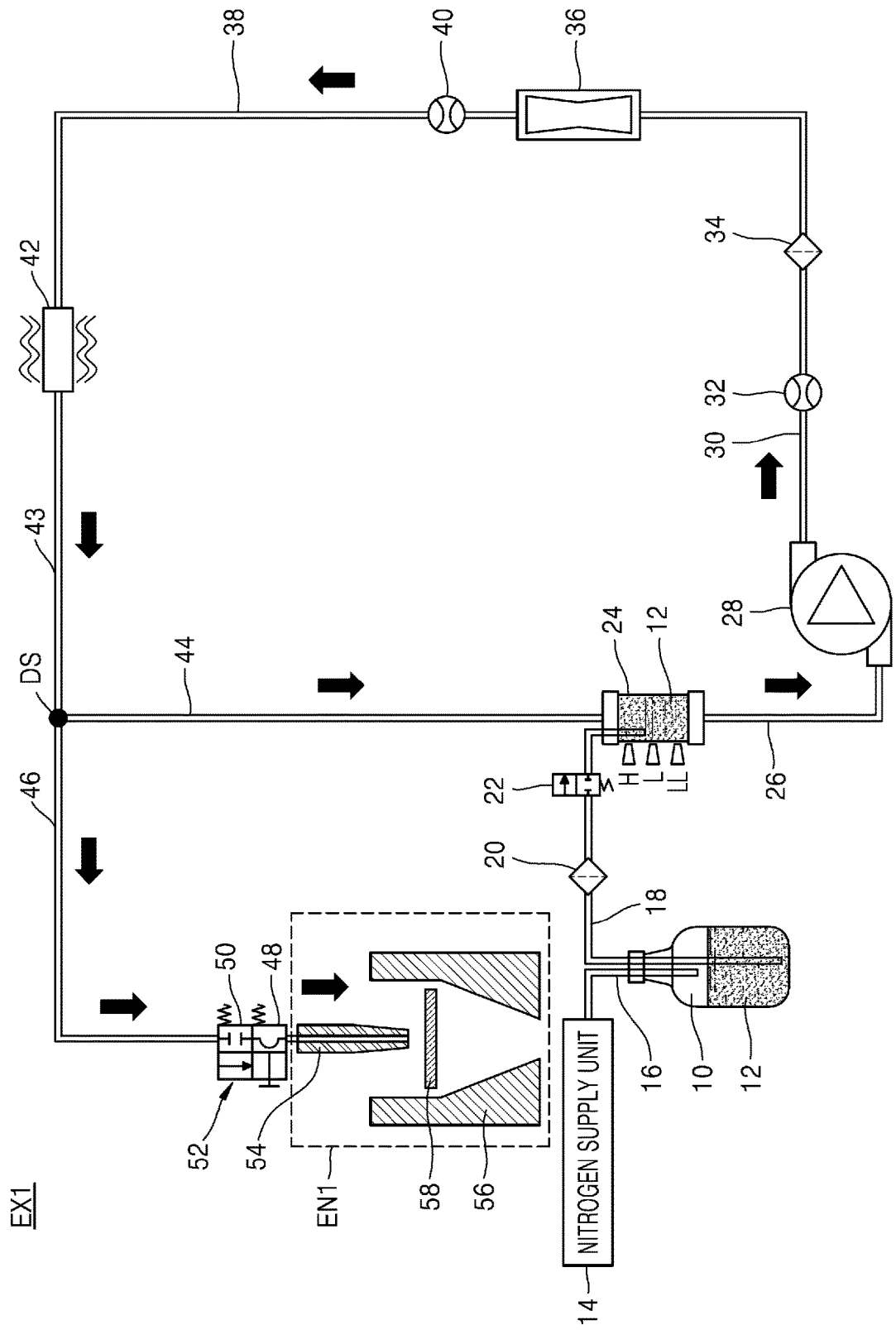
FIG. 1 is a schematic diagram illustrating a configuration of a photoresist coating apparatus according to an embodiment of the present inventive concept.

Hereinafter, embodiments are described in detail with reference to the accompanying drawings. The same reference numerals are used for the same components in the drawings, and redundant descriptions thereof may be omitted for economy of description.

FIG. 1 is a schematic diagram illustrating the configuration of a photoresist coating apparatus EX1 according to an embodiment.

In detail, FIG. 1 may be a diagram provided to illustrate that a photoresist 12 is supplied, circulated, and discharged in the photoresist coating apparatus EX1. In FIG. 1, the arrows show a flow of the photoresist 12 through the photoresist coating apparatus EX1 to apply the photoresist 12.

The photoresist coating apparatus EX1 may include a photoresist storage tank 10, a gas supply pipe 16, a photoresist suction pipe 18, a first filter 20, a first cutoff valve 22, and a photoresist trap tank 24.

The photoresist 12 is stored in the photoresist storage tank 10. A nitrogen supply unit 14 capable of supplying gas, such as nitrogen gas, and a gas supply pipe 16 may be connected to the photoresist storage tank 10. The photoresist suction pipe 18 capable of intaking the photoresist 12 may be connected to the photoresist storage tank 10. The photoresist 12 may be discharged to the photoresist suction pipe 18 by nitrogen supplied through the gas supply pipe 16 by the nitrogen supply unit 14.

The photoresist 12 discharged to the photoresist suction pipe 18 may be temporarily stored in the photoresist trap tank 24. In an embodiment, the photoresist trap tank 24 may include a level LL indicating the lowest level of the photoresist 12, a level L indicating a low level of the photoresist 12, and a level H indicating a high level of the photoresist 12 may be displayed.

The first filter 20 capable of filtering particles in the photoresist 12 may be installed on the photoresist suction pipe 18. In an embodiment, a size of particles filtered by the first filter 20 may be several tens of nm. The first cutoff valve 22 capable of turning on/off the flow of the photoresist 12 may be installed on the photoresist suction pipe 18. The first filter 20 may be positioned between the first cutoff valve 22 and the photo resist storage tank 10. Due to the first cutoff valve 22, the photoresist 12 may not flow backwards from the photoresist trap tank 24 to the photoresist storage tank 10.

In an embodiment, the photoresist coating apparatus EX1 may include a photoresist supply pipe connected to the photoresist trap tank 24. For example, in an embodiment the photoresist supply pipe may include first, second, third, and fourth photoresist supply pipes 26, 30, 38, and 43. The photoresist coating apparatus EX1 may also include a pump 28, a second filter 34, a photoresist pressing device 36, an ultrasonic generator 42, and a photoresist circulation pipe 44.

The first photoresist supply pipe 26, the pump 28, and the second photoresist supply pipe 30 may be sequentially connected to the photoresist trap tank 24. The photoresist 12 temporarily stored in the photoresist trap tank 24 may be supplied to the first photoresist supply pipe 26 by the pump 28 and discharged through the second photoresist supply pipe 30.

In an embodiment, the pump 28 may be a photoresist circulation pump installed on the photoresist supply pipe that is capable of circulating the photoresist 12 through the first to fourth photoresist supply pipes 26, 30, 38, and 43 and the photoresist circulation pipe 44, as is described in detail below. For example, the pump 28 may be a photoresist circulation pump that circulates photoresist 12 at a first flow rate.

A first sensor 32 and the second filter 34 may be installed on the second photoresist supply pipe 30. For example, the first sensor 32 and the second filter 34 may be on the second photoresist supply pipe 30 at the rear of the pump 28. The first sensor 32 may measure the pressure of the photoresist 12 supplied to the second photoresist supply pipe 30. The second filter 34 may filter particles in the photoresist 12 supplied to the second photoresist supply pipe 30 at the rear of the pump 28. For example, the first sensor 32 may be disposed between the pump 28 and the second filter 34

The photoresist pressing device 36 may be connected to the second photoresist supply pipe 30. For example, the photoresist pressing device 36 may be connected to the photoresist supply pipe, such as the second photoresist supply pipe 30, at a rear of the pump 28. The photoresist pressing device 36 may press the photoresist 12 supplied through the second photoresist supply pipe 30 and discharge the photoresist 12 to the third photoresist supply pipe 38.

As is described below, in an embodiment the photoresist pressing device 36 may be a flow rate control device that controls a flow rate of the photoresist 12 discharged through a photoresist discharge nozzle 54. In an embodiment, the photoresist pressing device 36 may be a flow rate control device that discharges the photoresist 12 discharged through the photoresist discharge nozzle 54 at a second flow rate that is faster than the first flow rate.

The third photoresist supply pipe 38 may be connected to the photoresist pressing device 36. A second sensor 40 may be installed on the third photoresist supply pipe 38 The second sensor 40 may measure the pressure of the photoresist 12 supplied to the third photoresist supply pipe 38.

The ultrasonic generator 42 may be connected to the third photoresist supply pipe 38. The ultrasonic generator 42 may be connected to the fourth photoresist supply pipe 43. The ultrasonic generator 42 may homogenize the photoresist 12 supplied through the third photoresist supply pipe 38 and discharge the homogenized photoresist 12 to the fourth photoresist supply pipe 43.

For example, the ultrasonic generator 42 may homogenize a polymer included in the photoresist 12 supplied through the third photoresist supply pipe 38 at the rear of the photoresist pressing device 36.

The fourth photoresist supply pipe 43 may be connected to the photoresist circulation pipe 44 through a branch socket DS. The photoresist circulation pipe 44 may be connected to the photoresist trap tank 24. The photoresist circulation pipe 44 may connect the photoresist supply pipe, such as the fourth photoresist supply pipe 43, to the photoresist trap tank 24 at the rear of the photoresist pressing device 36. The photoresist 12 supplied to the fourth photoresist supply pipe 43 may be discharged to the photoresist trap tank 24.

The photoresist coating apparatus EX1 may include a photoresist discharge pipe 46, a photoresist discharge valve 52, the photoresist discharge nozzle 54, and a photoresist coating bath 56.

The fourth photoresist supply pipe 43 may be connected to the photoresist discharge pipe 46 through the branch socket DS. For example, the photoresist discharge pipe 46 may be connected to the fourth photoresist supply pipe 43 at a rear of the photoresist circulation pipe 44. The photoresist 12 supplied to the fourth photoresist supply pipe 43 may be discharged to the photoresist discharge pipe 46. The photoresist discharge pipe 46 may be sequentially connected to the photoresist discharge valve 52 and the photoresist discharge nozzle 54.

The photoresist discharge valve 52 may include a second cutoff valve 50 for turning on/off the flow of the photoresist 12 and a suckback valve 48 adjusting a flow length 66 (FIG. 2) of the photoresist 12 from the photoresist discharge nozzle 54. The photoresist 12 supplied to the photoresist discharge pipe 46 may be discharged to the photoresist coating bath 56 through the photoresist discharge nozzle 54. The photoresist 12 supplied to the photoresist discharge pipe 46 may be discharged to a wafer 58 in the photoresist coating bath 56 through the photoresist discharge nozzle 54.

Figure 2:
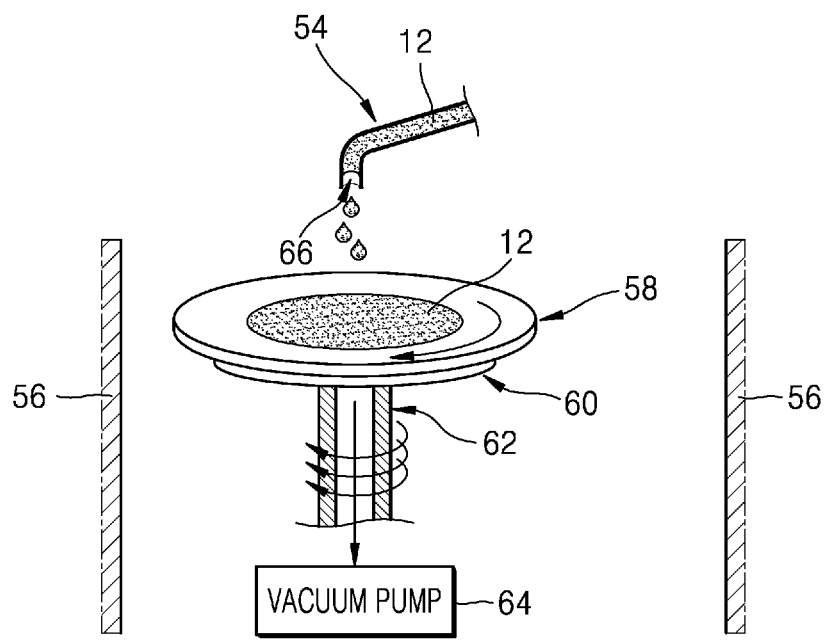
FIGS. 2 and 3 are detailed perspective views illustrating an internal configuration of a photoresist coating bath of the photoresist coating apparatus illustrated in FIG. 1 according to embodiments of the present inventive concept.
Figure 3:
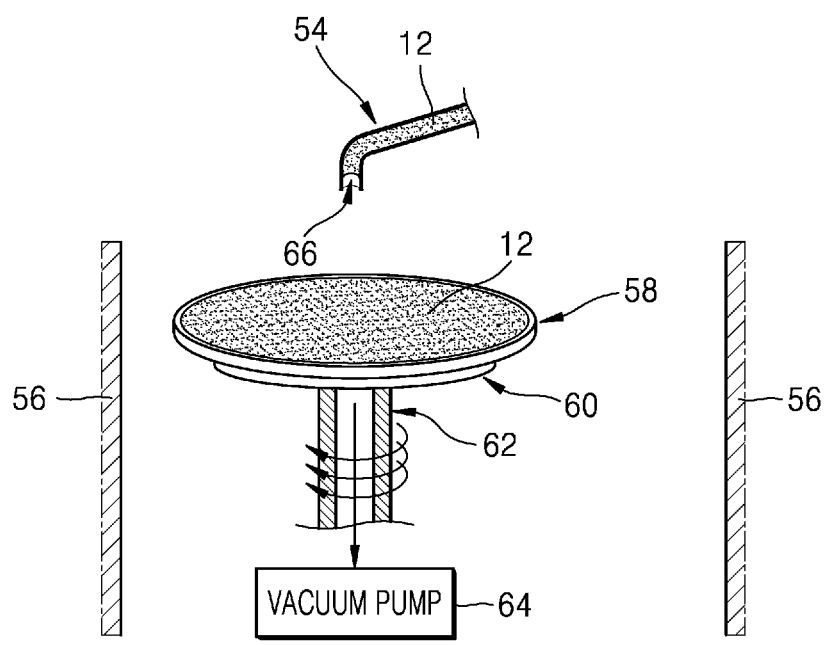

FIGS. 2 and 3 are detailed perspective views illustrating an internal configuration of the photoresist coating bath 56 of the photoresist coating apparatus EX1 illustrated in FIG. 1.

In detail, FIGS. 2 and 3 may be detailed views of portion EN1 of FIG. 1. As described above, the photoresist coating apparatus EX1 may include the photoresist coating bath 56. The inside of the photoresist coating bath 56 may include a table 60, a chuck 62, and a vacuum pump 64.

In an embodiment, the table 60 may support the wafer 58 on an upper surface thereof. In an embodiment, the chuck 62 may be connected to the table 60 and rotate the wafer 58 and the table 60. The vacuum pump 64 may hold the wafer 58 through the table 60 inside the chuck 62 by vacuum pressure.

As illustrated in FIGS. 2 and 3, the chuck 62 may rotate, and accordingly, the wafer 58 supported on the table 60 rotates as well. The photoresist 12 may be discharged onto the rotating wafer 58 through the photoresist discharge nozzle 54. In the photoresist discharge nozzle 54, the flow length 66 of the photoresist 12 may be adjusted by the suckback valve (48 in FIG. 1) described above.

As illustrated in FIG. 2, at an initial stage of rotation of the chuck 62, only a portion of the wafer 58 may be coated with the photoresist 12. When the chuck 62 rotates sufficiently, an entirety of the upper surface of the wafer 58 may be coated with the photoresist 12.

Figure 4:
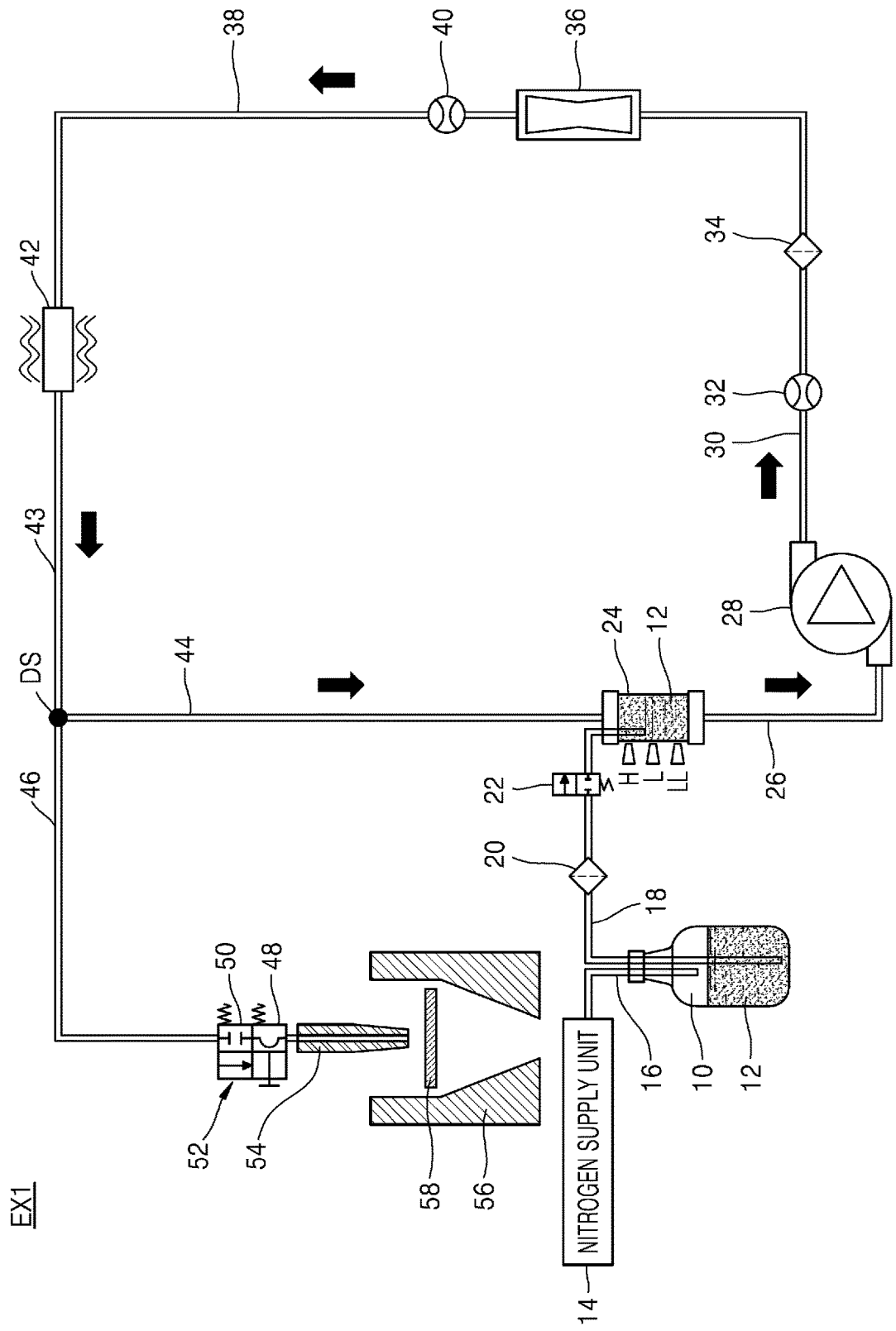
FIG. 4 is a diagram illustrating a photoresist circulation process of the photoresist coating apparatus of FIG. 1 according to an embodiment of the present inventive concept.
Figure 5:
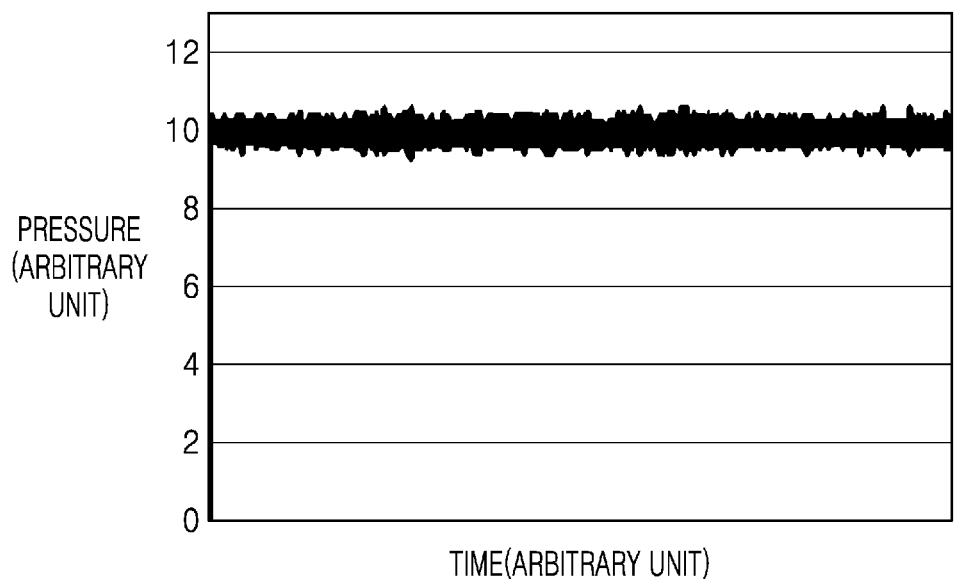
FIG. 5 is a diagram illustrating photoresist circulation pressure over time during a photoresist circulation process of the photoresist coating apparatus of FIG. 4 according to an embodiment of the present inventive concept.
Figure 6:
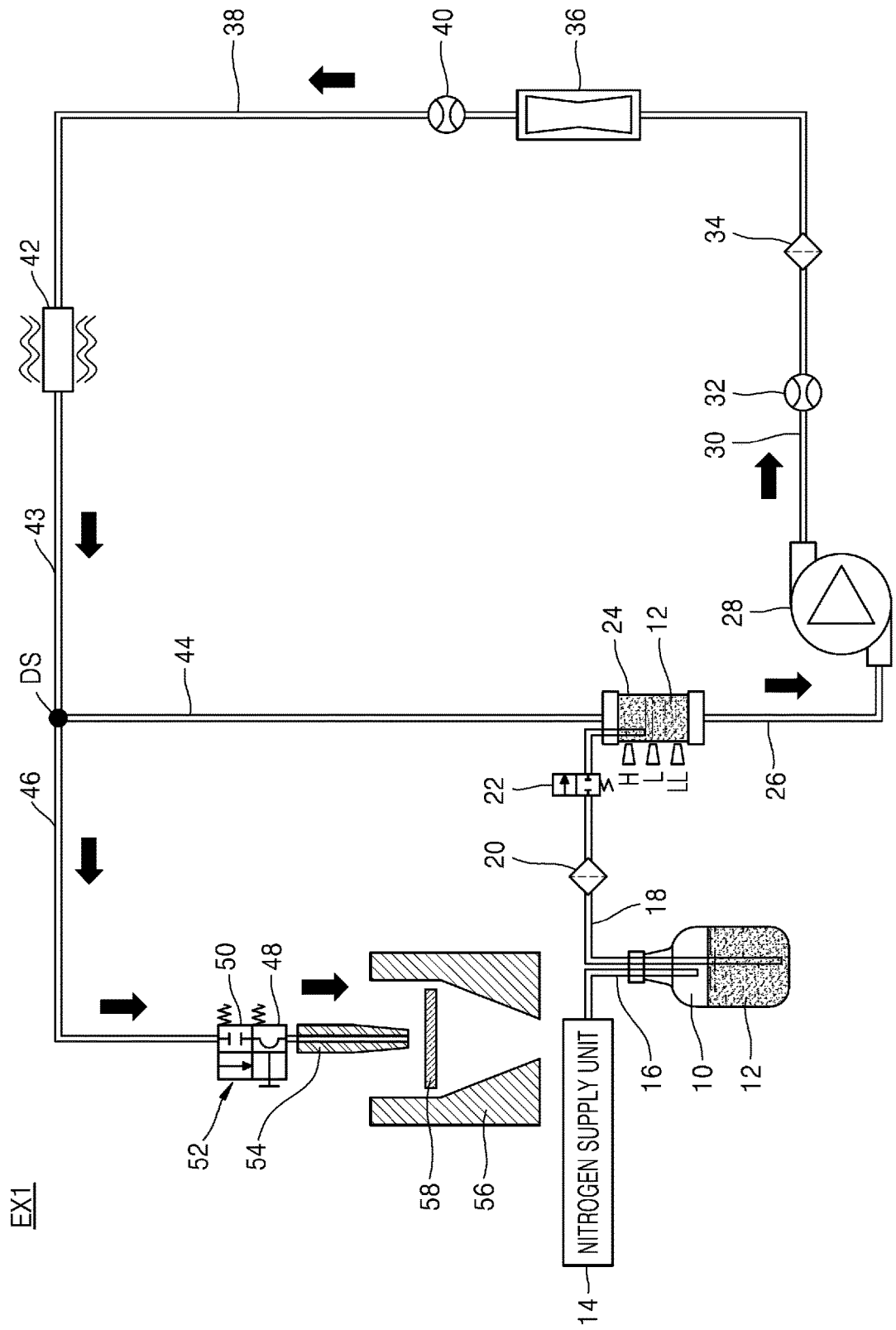
FIG. 6 is a diagram illustrating a photoresist discharging process of the photoresist coating apparatus of FIG. 1 according to an embodiment of the present inventive concept.

FIG. 4 is a diagram illustrating a photoresist circulation process of the photoresist coating apparatus EX1 of FIG. 1, FIG. 5 is a diagram illustrating photoresist circulation pressure over time during a photoresist circulation process of the photoresist coating apparatus EX1 of FIG. 4, and FIG. 6 is a diagram illustrating a photoresist discharging process of the photoresist coating apparatus of FIG. 1.

In detail, for the photoresist coating apparatus EX1 of FIGS. 4 and 6, a description given above for similar or identical elements with reference to FIG. 1 may be briefly given or omitted for economy of description. As illustrated in FIG. 4, when the second cutoff valve 50 constituting the photoresist discharge valve 52 is in an OFF state, the pump 28 may be a photoresist circulation pump that circulates the photoresist 12 temporarily stored in the photoresist trap tank 24 back to the photoresist trap tank 24 again through the first to fourth photoresist supply pipes 26, 30, 38, and 43. In FIG. 4, the arrows show circulation flow of the photoresist 12.

As illustrated in FIG. 4, the pump 28 may receive the photoresist 12 temporarily stored in the photoresist trap tank 24 and discharge the received photoresist 12 through the second photoresist supply pipe 30. The pump 28 may be a photoresist circulation pump that circulates the photoresist 12 at a first flow rate. For example, in an embodiment, the first flow rate may be about 0.05 milliliters (ml) per second. However, embodiments of the present inventive concept are not necessarily limited thereto.

Particles of the photoresist 12 supplied to the second photoresist supply pipe 30 by the pump 28 may be filtered by the second filter 34. In an embodiment, the photoresist 12 may be filtered by the pump 28 at the first flow rate, for example, about 0.05 milliliters (ml) per second. The first flow rate may be a filtering rate of the photoresist 12. In an embodiment, the first flow rate may be lower than a second flow rate described below which is a discharge rate of the photoresist 12.

In addition, a size of the particles filtered by the second filter 34 may be different from the size of particles filtered by the first filter 20. For example, in an embodiment the size of particles filtered by the second filter 34 may be several nm. The size of particles filtered by the second filter 34 may be smaller than the size of particles filtered by the first filter 20.

The photoresist 12 supplied to the second photoresist supply pipe 30 may be supplied to the photoresist pressing device 36. As illustrated in FIG. 6, when the second cutoff valve 50 constituting the photoresist discharge valve 52 is in an ON state, the photoresist pressing device 36 may be a flow rate control device that controls a flow rate of the photoresist 12 discharged through the photoresist discharge nozzle 54.

The photoresist pressing device 36 may discharge the photoresist 12 discharged through the photoresist discharge nozzle 54 at a second flow rate. The second flow rate may be a photoresist discharge rate. The photoresist pressing device 36 may be a flow rate control device that circulates the photoresist 12 at a second flow rate that is greater than the first flow rate. For example, in an embodiment, the second flow rate may be about 1 milliliter (ml) per second. However, embodiments of the present inventive concept are not necessarily limited thereto. In an embodiment, the second flow rate may be several tens of times greater than the first flow rate, such as 20 times greater than the first flow rate. However, embodiments of the present inventive concept are not necessarily limited thereto. In FIG. 6, the arrows indicate discharge flow of the photoresist 12.

The photoresist 12 supplied to the third photoresist supply pipe 38 by the photoresist pressing device 36 may pass through the ultrasonic generator 42. In an embodiment, the ultrasonic generator 42 may homogenize the photoresist 12 supplied through the third photoresist supply pipe 38 and supply the homogenized photoresist 12 to the fourth photoresist supply pipe 43.

The photoresist 12 supplied to the fourth photoresist supply pipe 43 may be collected by the photoresist trap tank 24 through the branch socket DS and the photoresist circulation pipe 44. As illustrated in FIG. 5, when the photoresist 12 temporarily stored in the photoresist trap tank 24 is circulated back to the photoresist trap tank 24 through the first to fourth photoresist supply pipes 26, 30, 38, and 43 and the photoresist circulation pipe 44, the pressure of the photoresist 12 applied to the first to fourth photoresist supply pipes 26, 30, 38, and 43 and the photoresist circulation pipe 44 may be uniform over time, as illustrated in FIG. 5.

In the photoresist coating apparatus EX1 as described above, the photoresist 12 may be circulated through the first to fourth photoresist supply pipes 26, 30, 38, and 43 and the photoresist circulation pipe 44 using the pump 28. Accordingly, in the photoresist coating apparatus EX1, the photoresist 12 does not stay in the first to fourth photoresist supply pipes 26, 30, 38, and 43 and the photoresist circulation pipe 44, so that the polymer of the photoresist 12 does not aggregate, thereby significantly reducing the formation of gel-like particles.

For example, in the photoresist coating apparatus EX1 according to an embodiment of the present inventive concept, the photoresist 12 may not stay (e.g., may not stall or remain still) in the first to fourth photoresist supply pipes 26, 30, 38, and 43 and the photoresist circulation pipe 44 and may stay (e.g., may stall or remain still) only in the photoresist discharge pipe 46.

In an embodiment, in the photoresist coating apparatus EX1, the ratio of the first to fourth photoresist supply pipes 26, 30, 38, and 43 and the photoresist circulation pipe 44, such as the ratio of the circulation line, is 97.9%, and the ratio of the photoresist discharge pipe 46, such as a retention line, may be 2.1%. In the photoresist coating apparatus EX1, the length of the pipe in which the photoresist 12 stays (e.g., remains still) may be significantly reduced, thereby easily removing gel-like particles.

By including the pump 28, the second filter 34, and the photoresist pressing device, the photoresist coating apparatus EX1 may be configured such that a filtering speed of the photoresist 12 is different from a discharge speed of the photoresist 12. For example, in the photoresist coating apparatus EX1, the filtering speed of the photoresist 12 may be less than the discharge speed of the photoresist 12. Accordingly, in the photoresist coating apparatus EX1, particles in the photoresist 12 supplied to the photoresist discharge nozzle 54 may be easily reduced.

In an embodiment, the photoresist coating apparatus EX1 may include the ultrasonic generator 42. The ultrasonic generator 42 may homogenize the photoresist 12 supplied through the photoresist supply pipe 38.

FIGS. 7 to 10 are diagrams illustrating the photoresist pressing device 36 of the photoresist coating apparatus EX1 of FIG. 1.

Figure 7:
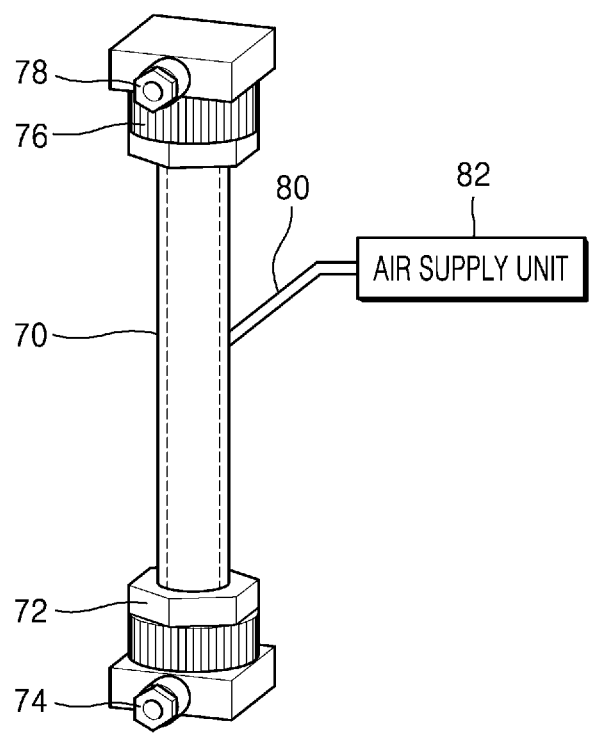
FIGS. 7 to 10 are diagrams illustrating a photoresist pressing device of the photoresist coating apparatus of FIG. 1 according to embodiments of the present inventive concept.
Figure 8:
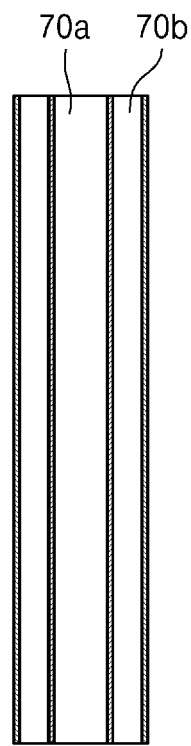
Figure 9:
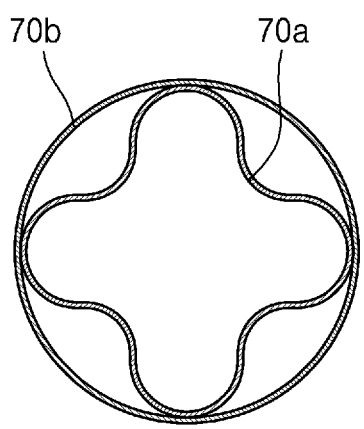

In detail, FIG. 7 is a perspective view of the photoresist pressing device 36. FIGS. 8 and 9 are cross-sectional and plan views of the photoresist pressing device 36, respectively, and FIG. 10 is a diagram illustrating expansion and contraction of an inner tube 70a of the photoresist pressing device 36.

As illustrated in FIGS. 7 to 9, in an embodiment the photoresist pressing device 36 may include a tube 70 having an inner tube 70a and an outer tube 70b spaced apart from the inner tube 70a and surrounding the inner tube 70a, and an air supply pipe 80 connected to the outer tube 70b An air supply unit 82 is connected (e.g., directly connected) to the air supply pipe 80. Air may be supplied to a space between the inner tube 70a and the outer tube 70b.

As illustrated in FIG. 7, in an embodiment the photoresist pressing device 36 may include a lower fastening member 72 and an upper fastening member 76 respectively fastened to lower and upper portions of the tube 70. In an embodiment, a photoresist injection hole 74 through which the photoresist (12 in FIG. 1) is injected and a photoresist discharge bole 78 through which the photoresist 12 is discharged may be installed on the lower fastening member 72 and the upper fastening member 76, respectively.

Figure 10:
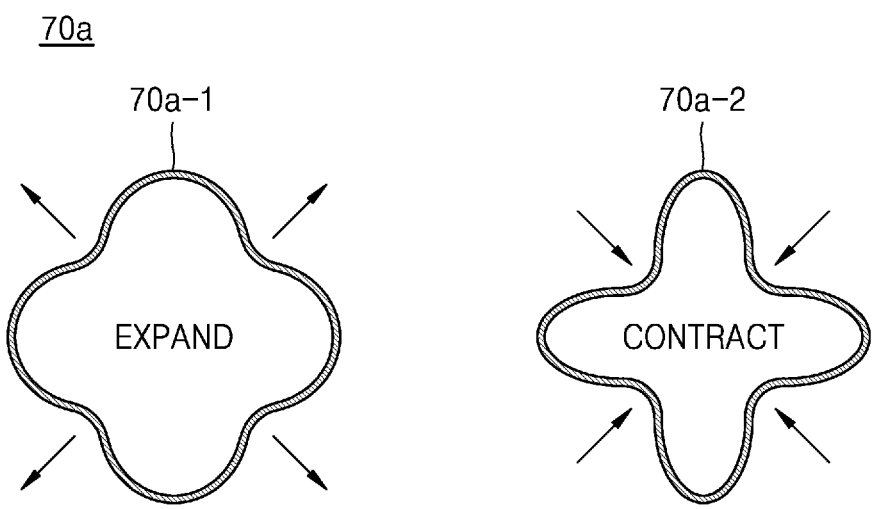

As illustrated in FIGS. 7 and 10, the inner tube 70a may be expanded or contracted by air supplied through the air supply pipe 80. The inner tube 70a may expand as indicated by reference numeral 70a-1 in FIG. 10. The inner tube 70a may contract as indicated by reference numeral 70a-2 in FIG. 10. As the inner tube 70a expands and contracts, the photoresist (12 in FIG. 1) supplied to the photoresist pressing device 36 may be discharged.

Figure 11:
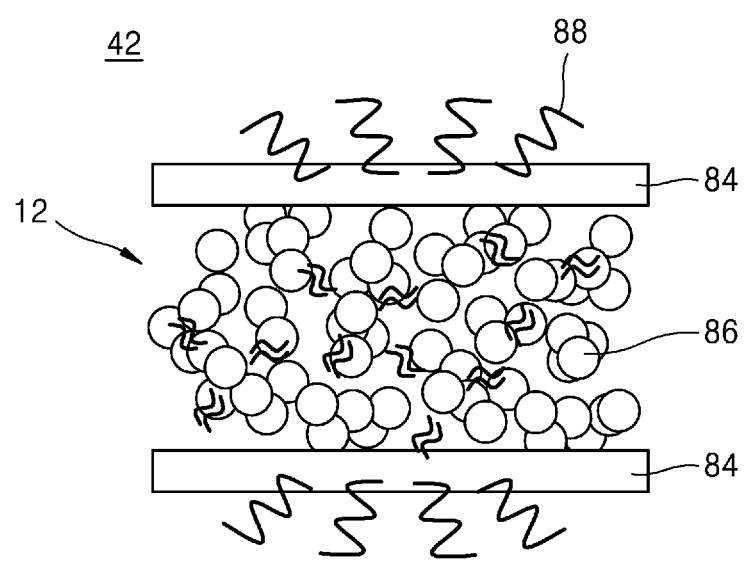
FIGS. 11 and 12 are diagrams illustrating a process of homogenizing a polymer included in a photoresist by an ultrasonic generator of the photoresist coating apparatus of FIG. 1 according to embodiments of the present inventive concept.
Figure 12:
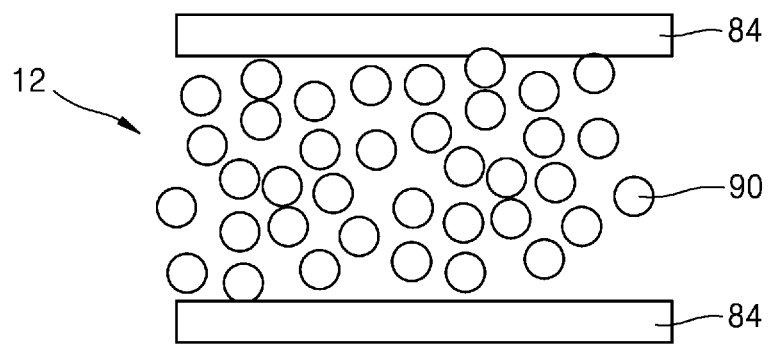
Figure 13:
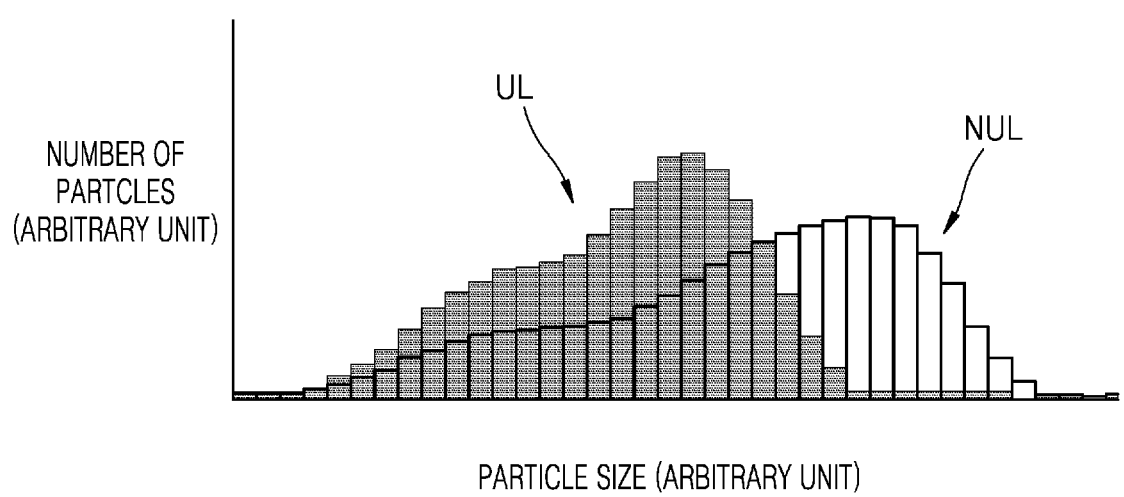
FIG. 13 is a diagram illustrating a particle size distribution and a particle size by an ultrasonic generator of the photoresist coating apparatus of FIG. 1 according to an embodiment of the present inventive concept.

FIGS. 11 and 12 illustrate a process of homogenizing the polymer included in the photoresist 12 by the ultrasonic generator 42 of the photoresist coating apparatus EX1 of FIG. 1, and FIG. 13 illustrates a graph showing a particle size distribution and a particle size in the photoresist 12 by the ultrasonic generator 42 of the photoresist coating apparatus EX1 of FIG. 1.

In an embodiment, as illustrated in FIG. 11, the photoresist 12 may pass through an internal pipe 84 of the ultrasonic generator 42. The photoresist 12 includes a polymer 86 aggregated in a volatile organic solvent.

The photoresist 12 has properties of aggregation over time and may be changed into gel-like particles, such as remaining still. As illustrated in FIG. 11, ultrasonic waves 88 may be applied to the photoresist 12 having the agglomerated polymer 86 using the ultrasonic generator 42. In an embodiment, the ultrasonic waves 88 may have a frequency of about several tens of kilohertz to about several megahertz.

When the ultrasonic waves 88 are applied using the ultrasonic generator 42, the agglomerated polymer 86 in the photoresist 12 may be changed into a homogenized polymer 90, as illustrated in FIG. 12. Accordingly, gel-like particles may not be formed in the photoresist 12 over time. When the photoresist 12 includes a homogenized polymer, the uniformity of the photoresist coated on the wafer may increase.

In addition, when the ultrasonic waves 88 are applied using the ultrasonic generator 42, the particle size distribution and particle size may be reduced as illustrated in FIG. 13. In FIG. 13, the reference letter NUL indicates a case in which the ultrasonic wave 88 is not applied to the photoresist 12, and the reference letter UL indicates a case in which the ultrasonic wave 88 is applied to the photoresist 12.

Figure 14:
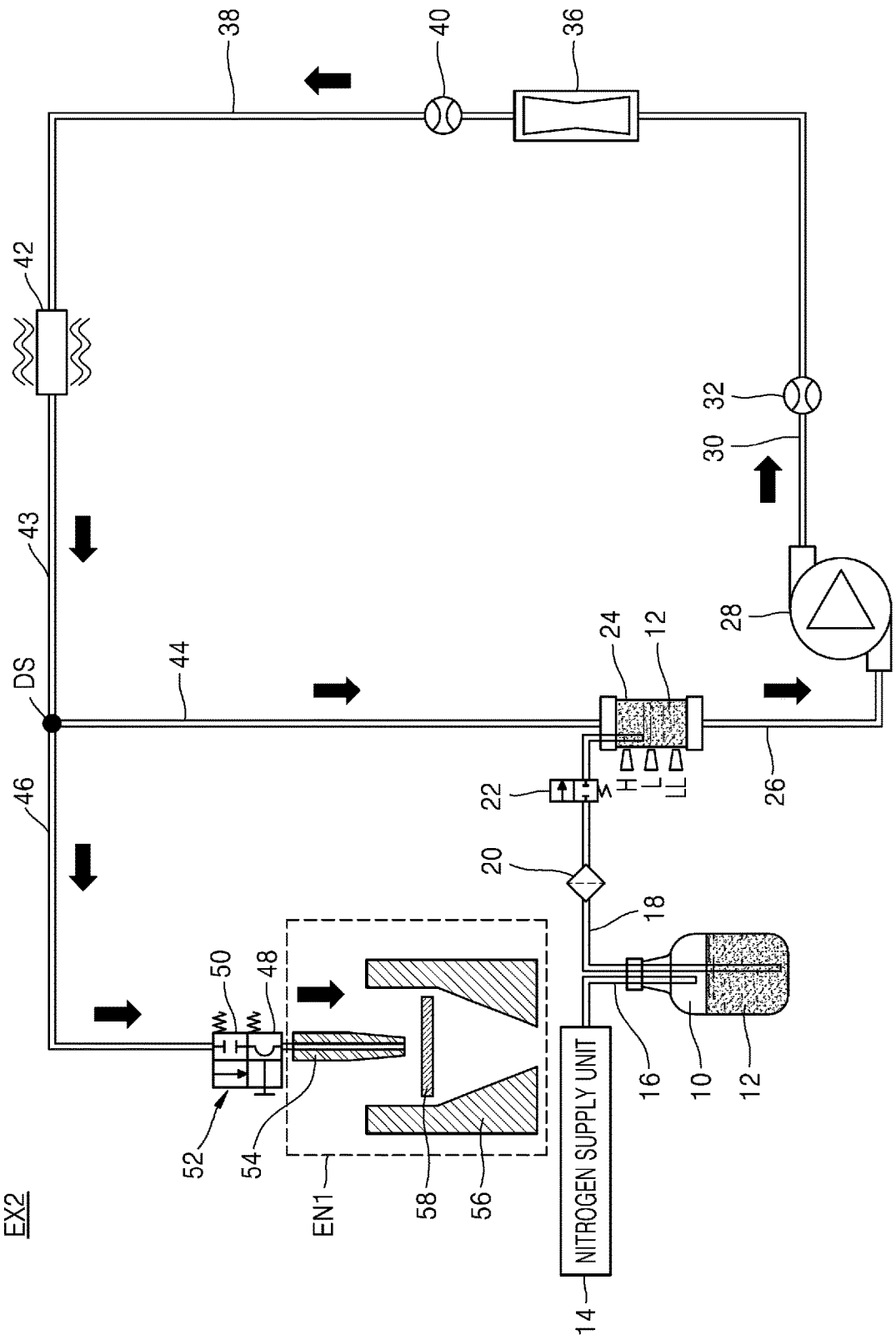
FIGS. 14 and 15 are schematic diagrams illustrating a configuration of a photoresist coating apparatus according to embodiments of the present inventive concept.
Figure 15:
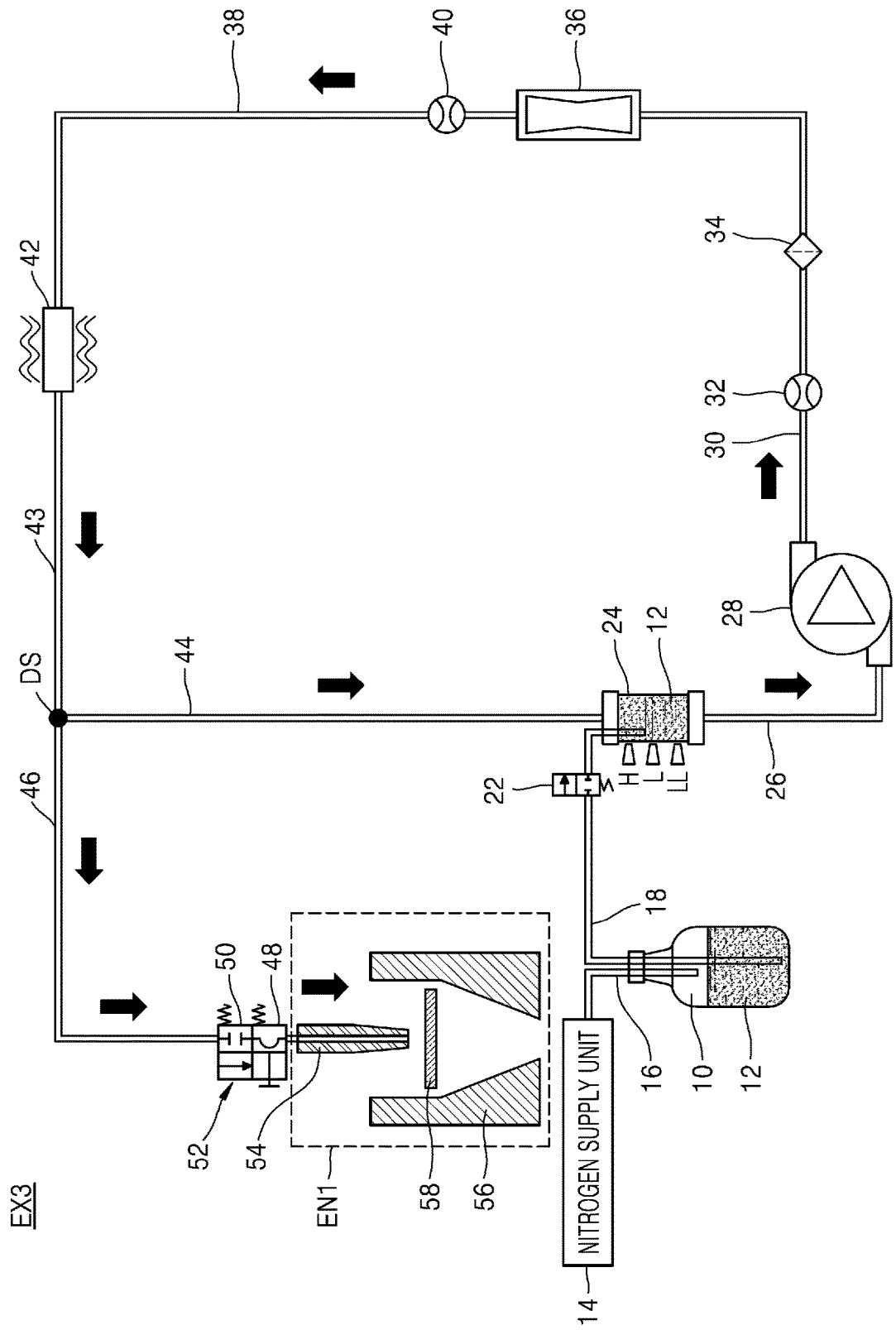

FIGS. 14 and 15 are schematic diagrams illustrating configurations of photoresist coating apparatuses EX2 and EX3 according to an embodiment.

In an embodiment, compared to the photoresist coating apparatus EX1 of FIG. 1, the photoresist coating apparatus EX2 of FIG. 14 may be the same as the first photoresist coating apparatus EX1, except that the photoresist coating apparatus EX2 may include the first filter 20 but not the second filter 34.

Compared to the photoresist coating apparatus EX1 of FIG. 1, the photoresist coating apparatus EX3 of FIG. 15 may be the same as the photoresist coating apparatus EX1 of FIG. 1, except that the photoresist coating apparatus EX3 may not include the first filter 20 but includes the second filter 34. With respect to FIGS. 14 and 15, the description of similar or identical elements given above with reference to FIG. 1 is briefly given or omitted for economy of description.

The first filter 20 of the photoresist coating apparatus EX2 of FIG. 14 may be installed between the photoresist storage tank 10 and the photoresist trap tank 24. The first filter 20 may be installed to filter particles in the photoresist 12 in the photoresist suction pipe 18. In the photoresist coating apparatus EX2 of FIG. 14, the first filter 20 is not installed on the circulation pipe, so the particles may be filtered in the photoresist only once, such as by the first filter 20.

The second filter 34 of the photoresist coating apparatus EX3 of FIG. 15 may be installed between the photoresist trap tank 24 and the photoresist pressing device 36. The second filter 34 may be installed on the second photoresist supply pipe 30 to filter particles in the photoresist 12. In the photoresist coating apparatus EX3 of FIG. 15, the second filter 34 may be installed on the circulation line and the particles in the photoresist 12 may be filtered several times, such as by the second filter 34.

As described above, in the photoresist coating apparatus EX2 and the photoresist coating apparatus EX3, the first filter 20 and the second filter 34 may be selectively installed to easily remove particles in the photoresist 12, thereby increasing coating quality of the photoresist 12.

Figure 16:
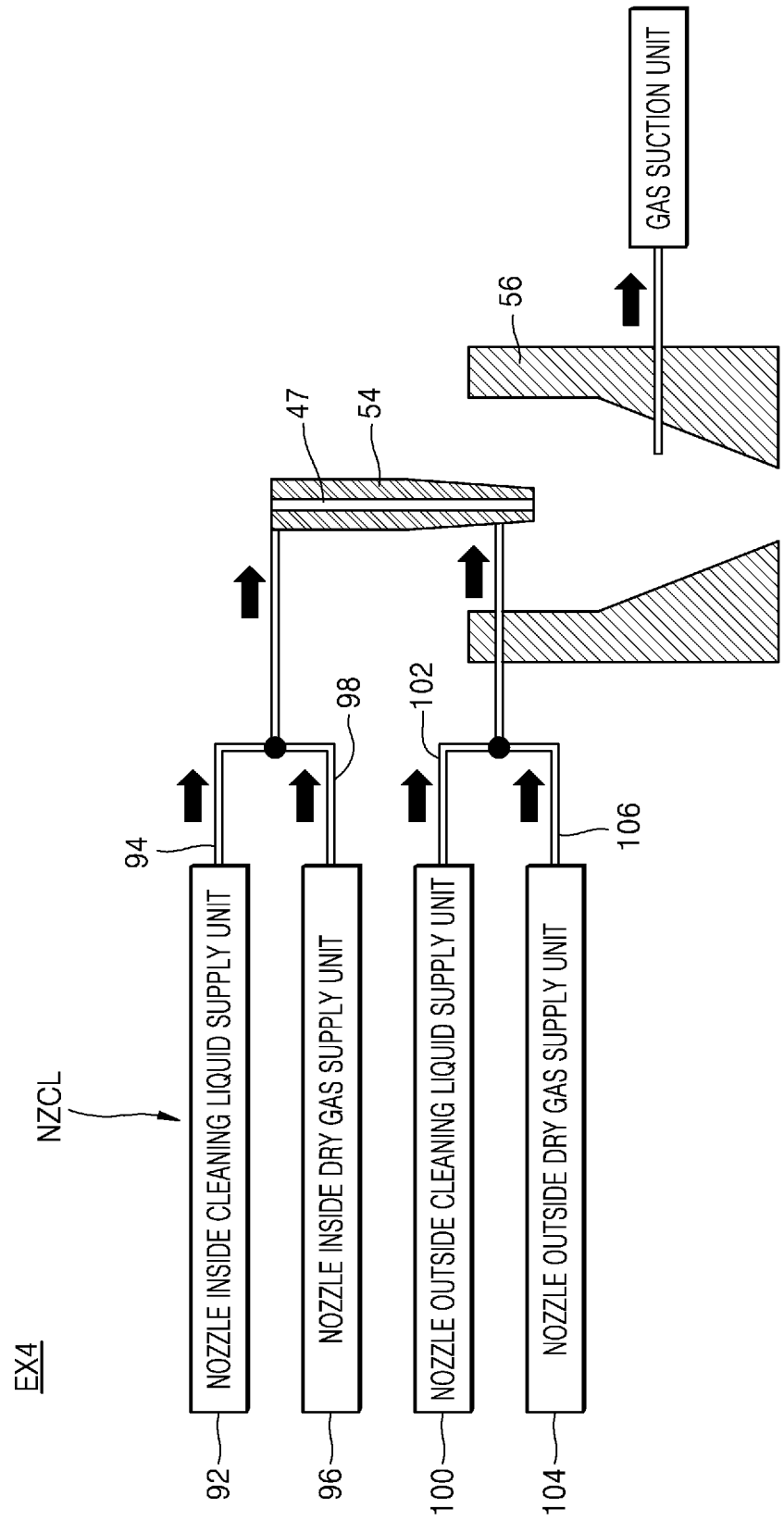
FIG. 16 is a diagram illustrating a configuration of a photoresist coating apparatus according to an embodiment of the present inventive concept.

FIG. 16 is a diagram illustrating a configuration of a photoresist coating apparatus EX4 according to an embodiment.

In an embodiment, compared with the photoresist coating apparatus EX1 of FIG. 1, the photoresist coating apparatus EX4 may be the same as the photoresist coating apparatus EX1 of FIG. 1, except that a nozzle cleaning device NZCL is further installed. For example, the nozzle cleaning device NZCL may be installed on the photoresist discharge nozzle 54. In the photoresist coating apparatus EX4 of FIG. 16, only the nozzle cleaning device NZCL is illustrated.

The photoresist coating apparatus EX4 may include the photoresist coating bath 56 and the photoresist discharge nozzle 54. The photoresist discharge nozzle 54 may include a nozzle pipe 47. The photoresist (12 in FIG. 1) may be supplied to the nozzle pipe 47.

In an embodiment, the nozzle cleaning device NZCL may include a nozzle inside cleaning liquid supply unit 92 capable of cleaning the inside surfaces of the photoresist discharge nozzle 54, such as the nozzle pipe 47, and a nozzle inside dry gas supply unit 96.

The nozzle inside cleaning liquid supply unit 92 may clean the photoresist discharge pipe 46 by supplying a cleaning liquid, such as thinner, through the nozzle inside cleaning liquid supply pipe 94. The nozzle inside dry gas supply unit 96 may dry the nozzle pipe 47 by supplying a dry gas, such as nitrogen gas, through the first dry gas supply pipe 98. However, embodiments of the present inventive concept are not necessarily limited thereto.

In an embodiment, the nozzle cleaning device NZCL may include a nozzle outside cleaning liquid supply unit 100 capable of cleaning the outside surfaces of the photoresist discharge nozzle 54 and a nozzle outside dry gas supply unit 104. The nozzle outside cleaning liquid supply unit 100 may clean the nozzle pipe 47 by supplying a cleaning liquid, such as thinner, through the external nozzle cleaning liquid supply pipe 102.

In an embodiment, the nozzle outside dry gas supply unit 104 may dry the photoresist discharge nozzle 54 by supplying a dry gas, such as nitrogen gas, through the second dry gas supply pipe 106. However, embodiments of the present inventive concept are not necessarily limited thereto. The nozzle cleaning device NZCL may include a gas suction pipe 108 and a gas suction unit 110 for intaking the dry gas supplied into the photoresist coating bath 56.

Figure 17:
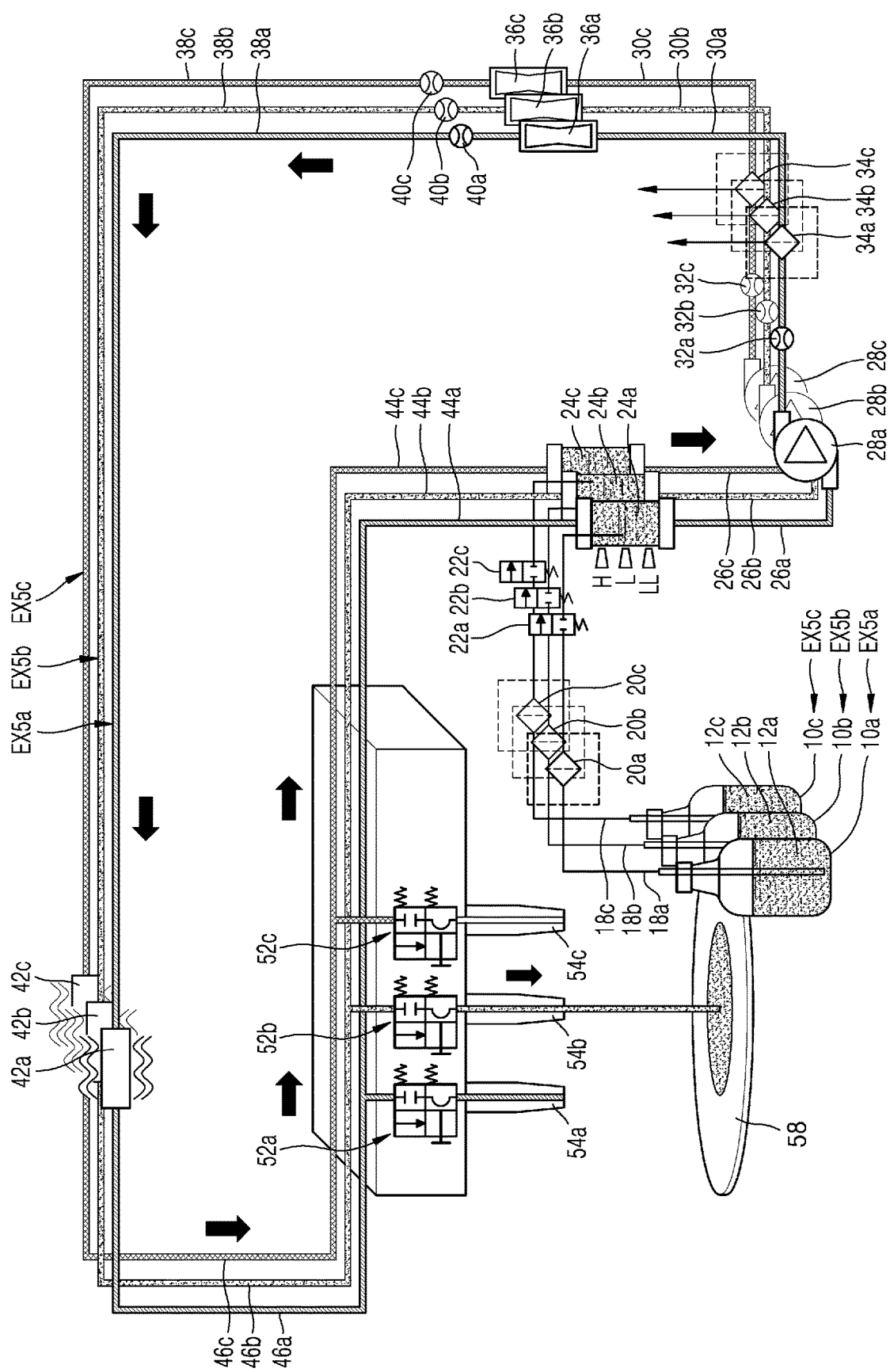
FIG. 17 is a schematic diagram illustrating a configuration of a photoresist coating apparatus according to an embodiment.

FIG. 17 is a schematic diagram illustrating a configuration of a photoresist coating apparatus EX5 according to an embodiment.

In an embodiment, compared to the photoresist coating apparatus EX1 of FIG. 1, the photoresist coating apparatus EX5 is similar to the photoresist coating apparatus EX1 of FIG. 1. However, the photoresist coating apparatus EX5 includes a plurality of sub-photoresist coating apparatuses EX5*a*, EX5*b*, and EX5*c* (e.g., first to third sub-photoresist coating apparatuses EX5*a*, EX5*b*, and EX5*c*). In FIG. 17, reference numerals which are the same as or similar to those in FIG. 1 denote like members. With respect to FIG. 17, the description given above with reference to FIG. 1 is briefly given or omitted for economy of description.

The photoresist coating apparatus EX5 may include the first sub-photoresist coating apparatus EX5*a*, the second sub-photoresist coating apparatus EX5*b*, and the third sub-photoresist coating apparatus EX5*c*. Each of the first sub-photoresist coating apparatus EX5*a*, the second sub-photoresist coating apparatus EX5*b*, and the third sub-photoresist coating apparatus EX5*c* may correspond to the photoresist coating apparatus EX1 of an embodiment shown in FIG. 1.

In an embodiment, the first sub-photoresist coating apparatus EX5*a* may include a first sub-photoresist storage tank 10*a*, a first sub-photoresist suction pipe 18*a*, a first sub-filter 20*a*, a first sub-cutoff valve 22*a*, and a first sub-photoresist trap tank 24*a*.

In an embodiment, the first sub-photoresist coating apparatus EX5*a* may include first sub-photoresist supply pipes 26*a*, 30*a*, and 38*a*, a first sub-pump 28*a*, a second sub-filter 34*a*, a first sub-photoresist pressing device 36*a*, a first sub-ultrasonic generator 42*a*, and a first sub-photoresist circulation pipe 44*a*.

In an embodiment, the first sub-photoresist coating apparatus EX5*a* may include a first sub-photoresist discharge pipe 46*a*, a first sub-photoresist discharge valve 52*a*, and a first sub-photoresist discharge nozzle 54*a*.

In an embodiment, the second sub-photoresist coating apparatus EX5*b* may include a second sub-photoresist storage tank 10*b*, a second sub-photoresist suction pipe 18*b*, a third sub-filter 20*b*, a second sub-cutoff valve 22*b*, and a second sub-photoresist trap tank 24*b*.

In an embodiment, the second sub-photoresist coating apparatus EX5*b* may include second sub-photoresist supply pipes 26*b*, 30*b*, and 38*b*, a second sub-pump 28*b*, a fourth sub-filter 34*b*, a second sub-photoresist pressing device 36*b*, a second sub-ultrasonic generator 42*b*, and a second sub-photoresist circulation pipe 44*b*.

In an embodiment, the second sub-photoresist coating apparatus EX5*b* may include a second sub-photoresist discharge pipe 46*b*, a second sub-photoresist discharge valve 52*b*, and a second sub-photoresist discharge nozzle 54*b*.

In an embodiment, the third sub-photoresist coating apparatus EX5*c* may include a third sub-photoresist storage tank 10*c*, a third sub-photoresist suction pipe 18*c*, a fifth sub-filter 20*c*, a third sub-cutoff valve 22*c*, and a third sub-photoresist trap tank 24*c*.

In an embodiment, the third sub-photoresist coating apparatus EX5*c* may include third sub-photoresist supply pipes 26*c*, 30*c*, and 38*c*, a third sub-pump 28*c*, a sixth sub-filter 34*c*, a third sub-photoresist pressing device 36*c*, a third sub-ultrasonic generator 42*c*, and a third sub-photoresist circulation pipe 44*c*.

In an embodiment, the third sub-photoresist coating apparatus EX5*c* may include a third sub-photoresist discharge pipe 46*c*, a third sub-photoresist discharge valve 52*c*, and a third sub-photoresist discharge nozzle 54*c*.

The photoresist coating apparatus EX5 may selectively use the first sub-photoresist coating apparatus EX5*a*, the second sub-photoresist coating apparatus EX5b, and the third sub-photoresist coating apparatus EX5c.

For example, the photoresist coating apparatus EX5 may coat the wafer 58 with a photoresist through the second sub-photoresist discharge nozzle 54b using the second sub-photoresist coating apparatus EX5b. In an embodiment, when using the second sub-photoresist coating apparatus EX5b, the photoresist coating apparatus EX5 may replace the first sub-photoresist storage tank 10a of the first sub-photoresist coating apparatus EX5a and remove particles by purging the first sub-photoresist supply pipes 26a, 30a, and 38a and the first sub-photoresist circulation pipe 44a with nitrogen or the like.

In an embodiment, when using the second sub-photoresist coating apparatus EX5b, the photoresist coating apparatus EX5 may replace the third sub-photoresist storage tank 10c of the third sub-photoresist coating apparatus EX5c and remove particles by purging the third sub-photoresist supply pipes 26c, 30c, and 38c and the third sub-photoresist circulation pipe 44c with nitrogen or the like.

While the present inventive concept has been particularly illustrated and described with reference to non-limiting embodiments thereof, it will be understood that various changes in form and details may be made therein without departing from the spirit and scope of the present inventive concept.

What is claimed is:

1. A photoresist coating apparatus comprising:
   a photoresist trap tank temporarily storing a photoresist;
   a photoresist supply pipe connected to the photoresist trap tank;
   a pump connected to the photoresist supply pipe;
   a photoresist pressing device connected to the photoresist supply pipe at a rear of the pump;
   a photoresist circulation pipe at a rear of the photoresist pressing device, the photoresist circulation pipe connecting the photoresist supply pipe to the photoresist trap tank;
   a photoresist discharge pipe connected to the photoresist supply pipe at a rear of the photoresist circulation pipe;
   a photoresist discharge valve connected to the photoresist discharge pipe; and
   a photoresist discharge nozzle connected to the photoresist discharge valve.

2. The photoresist coating apparatus of claim 1, further comprising:
   a photoresist storage tank storing the photoresist and a photoresist suction pipe connected to the photoresist storage tank,
   wherein the photoresist trap tank is connected to the photoresist suction pipe and the photoresist suction pipe discharges the photoresist to the photoresist trap tank for temporarily storing the photoresist.

3. The photoresist coating apparatus of claim 2, wherein the photoresist suction pipe includes a first filter filtering particles in the photoresist.

4. The photoresist coating apparatus of claim 3, wherein the photoresist supply pipe includes a second filter filtering particles in the photoresist at a rear of the pump.

5. The photoresist coating apparatus of claim 1, wherein the pump comprises a photoresist circulation pump circulating the photoresist through the photoresist supply pipe and the photoresist circulation pipe.

6. The photoresist coating apparatus of claim 1, wherein the photoresist pressing device comprises a flow rate control device controlling a flow rate of the photoresist discharged through the photoresist discharge nozzle.

7. The photoresist coating apparatus of claim 1, further comprising an ultrasonic generator on the photoresist supply pipe at the rear of the photoresist pressing device, the ultrasonic generator homogenizing a polymer included in the photoresist.

8. The photoresist coating apparatus of claim 1, wherein the photoresist discharge valve includes:
   a cutoff valve turning a flow of photoresist on and off; and
   a suckback valve adjusting a flow length of the photoresist from the photoresist discharge nozzle.

9. The photoresist coating apparatus of claim 1, further including a nozzle cleaning device cleaning inside surfaces and outside surfaces of the photoresist discharge nozzle.

10. A photoresist coating apparatus comprising:
    a photoresist storage tank storing a photoresist, a photoresist suction pipe connected to the photoresist storage tank;
    a photoresist trap tank connected to the photoresist suction pipe, the photoresist trap tank temporarily storing the photoresist;
    a photoresist supply pipe connected to the photoresist trap tank;
    a pump connected to the photoresist supply pipe;
    a photoresist pressing device connected to the photoresist supply pipe at a rear of the pump;
    a photoresist circulation pipe at a rear of the photoresist pressing device, the photoresist circulation pipe connecting the photoresist supply pipe to the photoresist trap tank;
    a photoresist discharge pipe connected to the photoresist supply pipe at a rear of the photoresist circulation pipe;
    a photoresist discharge valve connected to the photoresist discharge pipe; and
    a photoresist discharge nozzle connected to the photoresist discharge valve,
    wherein the pump is a photoresist circulation pump circulating the photoresist at a first flow rate, and
    the photoresist pressing device is a flow rate control device discharging the photoresist at a second flow rate that is greater than the first flow rate.

11. The photoresist coating apparatus of claim 10, wherein:
    the photoresist discharge valve includes a cutoff valve turning a flow of the photoresist on and off,
    the pump circulates the photoresist through the photoresist supply pipe and the photoresist circulation pipe when the cutoff valve is in an OFF state; and
    the photoresist pressing device discharges the photoresist through the photoresist discharge nozzle when the cutoff valve is in an ON state.

12. The photoresist coating apparatus of claim 10, wherein the photoresist suction pipe includes a first filter filtering particles in the photoresist.

13. The photoresist coating apparatus of claim 12, wherein the photoresist supply pipe includes a second filter filtering particles in the photoresist at the rear of the pump.

14. The photoresist coating apparatus of claim 10, wherein:
    the photoresist pressing device includes a tube including an inner tube and an outer tube that is spaced apart from the inner tube and surrounds the inner tube; and
    an air supply pipe connected to the outer tube.

15. The photoresist coating apparatus of claim 10, wherein an ultrasonic generator homogenizing a polymer included in the photoresist is on the photoresist supply pipe at a rear of the photoresist pressing device.

16. The photoresist coating apparatus of claim 10, further including a nozzle cleaning device cleaning inside surfaces and outside surfaces of the photoresist nozzle.

17. A photoresist coating apparatus comprising:
a photoresist storage tank storing a photoresist;
a photoresist suction pipe connected to the photoresist storage tank;
a first filter connected to the photoresist suction pipe, the first filter filtering particles in the photoresist;
a photoresist trap tank connected to the photoresist suction pipe, the photoresist trap tank temporarily storing the photoresist;
a photoresist supply pipe connected to the photoresist trap tank;
a pump connected to the photoresist supply pipe;
a second filter connected to the photoresist supply pipe at a rear of the pump, the second filter filtering particles in the photoresist;
a photoresist pressing device connected to the photoresist supply pipe at a rear of the second filter,
a photoresist circulation pipe at a rear of the photoresist pressing device, the photoresist circulation pipe connecting the photoresist supply pipe to the photoresist trap tank;
a photoresist discharge pipe connected to the photoresist supply pipe at a rear of the photoresist circulation pipe;
a photoresist discharge valve connected to the photoresist discharge pipe; and
a photoresist discharge nozzle connected to the photoresist discharge valve,
wherein the pump is a photoresist circulation pump circulating the photoresist at a first flow rate, and
the photoresist pressing device is a flow rate control device discharging the photoresist at a second flow rate that is greater than the first flow rate.

18. The photoresist coating apparatus of claim 17, wherein:
the photoresist pressing device includes a tube including an inner tube and an outer tube that is spaced apart from the inner tube and surrounds the inner tube;
an air supply pipe connected to the outer tube; and
the photoresist is injected into a space between the inner tube and the outer tube, and the photoresist pressing device receives or discharges the photoresist by contraction and expansion of the inner tube.

19. The photoresist coating apparatus of claim 17, wherein an ultrasonic generator homogenizing a polymer included in the photoresist is on the photoresist supply pipe at a rear of the photoresist pressing device.

20. The photoresist coating apparatus of claim 17, further including a nozzle cleaning device cleaning inside surfaces and outside surfaces of the photoresist discharge nozzle.

* * * * *